US012804906B2

(12) United States Patent
Bae et al.

(10) Patent No.: US 12,804,906 B2
(45) Date of Patent: Nov. 17, 2026

(54) VERTICAL NON-VOLATILE MEMORY DEVICE AND ELECTRONIC APPARATUS INCLUDING THE SAME

(71) Applicant: Samsung Electronics Co., Ltd., Suwon-si (KR)

(72) Inventors: Hagyoul Bae, Suwon-si (KR); Seungyeul Yang, Suwon-si (KR); Minhyun Lee, Suwon-si (KR); Jinseong Heo, Suwon-si (KR); Taehwan Moon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 738 days.

(21) Appl. No.: 18/062,245

(22) Filed: Dec. 6, 2022

(65) Prior Publication Data

US 2023/0180481 A1 Jun. 8, 2023

(30) Foreign Application Priority Data

Dec. 7, 2021 (KR) ........................ 10-2021-0174019

(51) Int. Cl.

*H10B 51/20* (2023.01)
*G11C 11/22* (2006.01)
*H10B 51/30* (2023.01)

(52) U.S. Cl.

CPC .............. *H10B 51/20* (2023.02); *G11C 11/22* (2013.01); *G11C 11/223* (2013.01); *H10B 51/30* (2023.02)

(58) Field of Classification Search

CPC ........ H10B 51/00; H10B 51/20; H10B 51/30; G11C 11/22; G11C 11/223

See application file for complete search history.

(56) References Cited

U.S. PATENT DOCUMENTS 10,937,809 B1 * 3/2021 Sharangpani .......... H10B 51/40
2019/0198525 A1 * 6/2019 Arreghini .............. H10B 43/27
2019/0259778 A1 8/2019 Yoo
2020/0105773 A1 4/2020 Morris et al.

(Continued)

FOREIGN PATENT DOCUMENTS

CN 113871395 A * 12/2021 ........... H10D 30/701
KR 2019/0105174 A 9/2019

(Continued)

OTHER PUBLICATIONS

Extended European Search Report dated May 8, 2023, issued in corresponding European Patent Application No. 22211438.1.

(Continued)

*Primary Examiner* — Matthew E Warren

(74) *Attorney, Agent, or Firm* — Harness, Dickey & Pierce, P.L.C.

(57) ABSTRACT

A vertical non-volatile memory device may include a plurality of insulating layers and a plurality of conductive layers alternately stacked on a surface of a substrate in a direction perpendicular to the surface of the substrate; a channel layer on the substrate, where the channel layer extends in the direction perpendicular to the surface of the substrate and the channel layer may be on lateral surfaces of the plurality of insulating layers and lateral surfaces of the plurality of conductive layers; and a ferroelectric layer between the channel layer and the lateral surfaces of the plurality of conductive layers.

19 Claims, 12 Drawing Sheets

(56) References Cited

U.S. PATENT DOCUMENTS

| | | | | |
|---|---|---|---|---|
| 2020/0119047 | A1* | 4/2020 | Yoo | H10D 64/033 |
| 2021/0043654 | A1* | 2/2021 | Yoo | H10B 51/00 |
| 2021/0098479 | A1 | 4/2021 | Son et al. | |
| 2021/0126013 | A1 | 4/2021 | Lai et al. | |
| 2021/0257407 | A1 | 8/2021 | Han et al. | |
| 2021/0358925 | A1* | 11/2021 | Takahashi | H10B 51/30 |
| 2021/0366932 | A1* | 11/2021 | Lee | H10B 51/10 |
| 2021/0375938 | A1* | 12/2021 | Lin | H10D 30/701 |

FOREIGN PATENT DOCUMENTS

| | | | |
|---|---|---|---|
| KR | 2021/0017091 | A | 2/2021 |
| KR | 2021/0037316 | A | 4/2021 |
| KR | 102247029 | B1 | 4/2021 |
| KR | 2021/0103305 | A | 8/2021 |
| KR | 2021/0143076 | A | 11/2021 |

OTHER PUBLICATIONS

Kai Ni et al., ‘Ferroelectric ternary content addressable memory for one-shot learning’ *Nature Electronics*, vol. 2, Nov. 2019, pp. 521-529.

Qing Luo et al., ‘Hybrid 1T e-DRAM and e-NVM Realized in One 10 nm node Ferro FinFET device with Charge Trapping and Domain Switching Effects’ IEEM 18-47 to 18-50, 2018.

Korean Office Action dated Feb. 22, 2026 for corresponding Korean Patent Application No. 10-2021-0174019 and its English-language translation.

* cited by examiner

VERTICAL NON-VOLATILE MEMORY DEVICE AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2021-0174019, filed on Dec. 7, 2021 in the Korean Intellectual Property Office, the disclosure of which is incorporated by reference herein in its entirety.

BACKGROUND

1. Field

The present disclosure relates to a vertical non-volatile memory device and an electronic apparatus including the vertical non-volatile memory device.

2. Description of the Related Art

As hard disk drives are being replaced with solid state drives (SSDs), NAND flash memory devices, which are non-volatile memory devices, have been widely used. Recently, vertical NAND flash memory devices, in which a plurality of unit cells are stacked in a direction perpendicular to a substrate for miniaturization and a high degree of integration, have been developed.

SUMMARY

Provided are vertical non-volatile memory devices and electronic apparatuses including the vertical non-volatile memory devices.

Additional aspects will be set forth in part in the description which follows and, in part, will be apparent from the description, or may be learned by practice of the presented embodiments of the disclosure.

According to an embodiment, a vertical non-volatile memory device may include a substrate; a plurality of insulating layers and a plurality of conductive layers alternately stacked on a surface of a substrate in a direction perpendicular to the surface of the substrate; a channel layer on the substrate, the channel layer extending in a direction perpendicular to the surface of the substrate, the channel layer on lateral surfaces of the plurality of insulating layers and lateral surfaces of the plurality of conductive layers; and a ferroelectric layer between the channel layer and the lateral surfaces of the plurality of conductive layers.

In some embodiments, each of the plurality of insulating layers and each of the plurality of conductive layers may extend in a direction parallel to the surface of the substrate.

In some embodiments, the channel layer may correspond to the plurality of conductive layers.

In some embodiments, the lateral surfaces of the plurality of conductive layers may be flat with the lateral surfaces of the plurality of insulating layers.

In some embodiments, the ferroelectric layer may be only on the lateral surfaces of the plurality of conductive layers such that the ferroelectric layer is not on the lateral surfaces of the plurality of insulating layers.

In some embodiments, the ferroelectric layer may extend onto the lateral surfaces of the plurality of insulating layers.

In some embodiments, the lateral surfaces of the plurality of conductive layers may be recessed from the lateral surfaces of the plurality of insulating layers.

In some embodiments, the lateral surfaces of the plurality of conductive layers may be recessed from the lateral surface of the plurality of insulating layers and may define gaps with underlying and overlying insulating layers among the plurality of insulating layers, and the gaps by the lateral surfaces of the plurality of conductive layers may be filled with the ferroelectric layer.

In some embodiments, the ferroelectric layer may extend onto the lateral surfaces of the plurality of insulating layers.

In some embodiments, the ferroelectric layer may extend to the lateral surfaces of the plurality of insulating layers from the lateral surfaces of the plurality of conductive layers.

In some embodiments, when a gate voltage is applied to the plurality of conductive layers, the gate voltage may induce an electric field stronger than a coercive field in which ferroelectric polarization switching occurs in the ferroelectric layer.

In some embodiments, each of the plurality of conductive layers may have a thickness of about 10 nm or less.

In some embodiments, each of the plurality of conductive layers may include a metal, a metal nitride, polysilicon, or a 2D conductive material.

In some embodiments, the channel layer may include Si, Ge, a Group III-V semiconductor, an oxide semiconductor, a nitride semiconductor, an oxynitride semiconductor, a 2D semiconductor material, quantum dots, or an organic semiconductor.

In some embodiments, the ferroelectric layer may include a fluorite-based material or perovskite.

In some embodiments, the ferroelectric layer may include an oxide of at least one of Hf and Zr. The ferroelectric layer may further include at least one dopant selected from the group consisting of Si, Al, La, Y, Sr, and Gd.

In some embodiments, a paraelectric layer may be between the ferroelectric layer and the channel layer.

In some embodiments, the paraelectric layer may include a silicon oxide, a silicon nitride, an aluminum oxide, or a silicon oxynitride.

According to an embodiment, an electronic apparatus may include the vertical non-volatile memory device described above.

According to an embodiment, a vertical non-volatile memory device may include a substrate; a plurality of insulating layers and a plurality of conductive layers alternately stacked on the substrate in a direction perpendicular to an upper surface of the substrate; a channel layer on the substrate, the channel layer extending in a direction perpendicular to the upper surface of substrate; and a ferroelectric layer over the upper surface of the substrate. The ferroelectric layer may be between the channel layer and at least one of the plurality of conductive layers. The ferroelectric layer may contact a lateral surface of one or more of the plurality of conductive layers.

In some embodiments, the ferroelectric layer may be among a plurality of ferroelectric layers spaced apart from each other on the upper surface of the substrate, and the plurality of ferroelectric layers may be between the plurality of conductive layers and the channel layer.

In some embodiments, the ferroelectric layer may contact a lateral surface of more than one of the plurality of conductive layers, and the ferroelectric layer may extend between the channel layer and multiple conductive layers among the plurality of conductive layers.

In some embodiments, the ferroelectric layer may include a fluorite-based material, perovskite, an oxide of Hf, an oxide of Zr, or an oxide of both Hf and Zr. Each of the plurality of conductive layers may have a thickness of about 10 nm or less.

According to an embodiment, an electronic apparatus may include the vertical non-volatile memory device described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
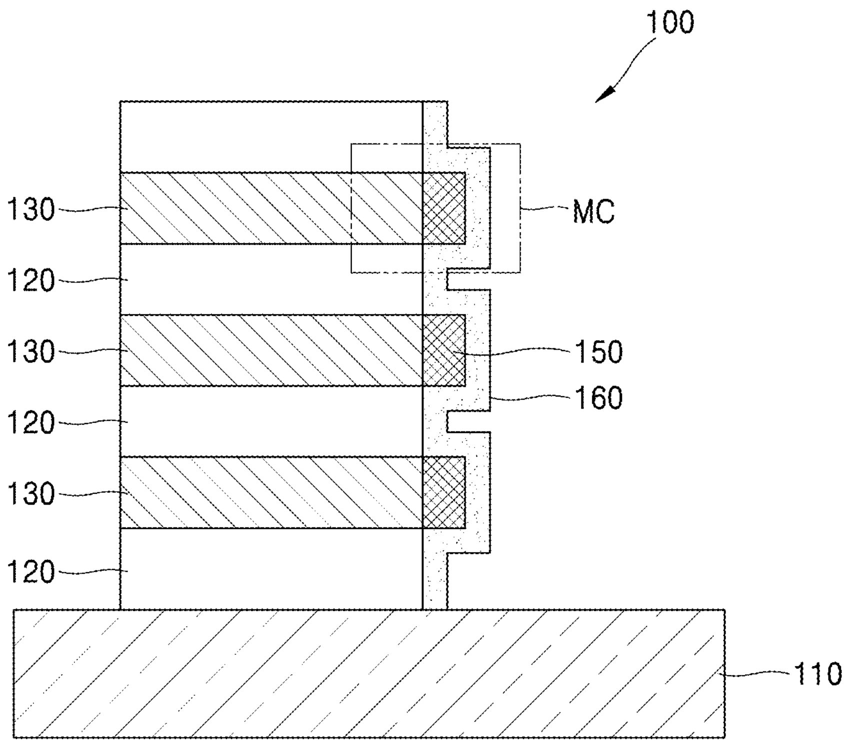
FIG. 1 is a cross-sectional view schematically illustrating a vertical non-volatile memory device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative determiner may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or example terms are just used herein to describe technical ideas and should not be considered for purposes of limitation unless defined by the claims.

FIG. 1 is a cross-sectional view schematically illustrating a vertical non-volatile memory (NVM) device 100 according to an example embodiment. The vertical non-volatile memory device 100 illustrated in FIG. 1 may be a vertical NAND flash memory device.

Referring to FIG. 1, the vertical non-volatile memory device 100 includes: a substrate 110; and a vertical stack structure in which a plurality of memory cells MC are stacked in a direction perpendicular to a surface of the substrate 110. The memory cells MC include insulating layers 120 and conductive layers 130 that are alternately stacked in a direction perpendicular to the surface of the substrate 110. FIG. 1 illustrates an example in which one vertical stack structure is provided on the substrate 110, but embodiments are not limited thereto. For example, a plurality of vertical stack structures may be provided apart from each other on the substrate 110.

The substrate 110 may include various materials. For example, the substrate 110 may include a semiconductor or semiconductor-on-insulator substrate, such as a single crystal silicon substrate, a compound semiconductor substrate, or a silicon-on-insulator (SOI) substrate. However, the listed materials are merely examples, and the substrate 110 may include various materials other than the listed materials. In addition, the substrate 110 may further include, for example, an impurity region formed by doping, an electronic element such as a transistor, or a peripheral circuit configured to select and control memory cells which store data.

The insulating layers 120 and the conductive layers 130 are alternately stacked on the substrate 110 in a direction perpendicular to the surface of the substrate 110. Here, each of the insulating layers 120 and the conductive layers 130 may extend in a direction parallel to the surface of the substrate 110.

The conductive layers 130 correspond to gates, and a word line (not shown) may be electrically connected to the conductive layers 130. The conductive layers 130 may include, for example, a conductive material such as a metal, a metal nitride, polysilicon, or a 2D conductive material. However, the listed materials are merely examples, and the conductive layers 130 may include various other materials. The conductive layers 130 have a small thickness equal to or less than, for example, about 10 nm. However, embodiments are not limited thereto.

The insulating layers 120 are for insulation between the conductive layers 130 and may include, for example, a silicon oxide, silicon nitride, or the like. However, the listed materials are merely examples. The insulating layers 120 may have a thickness of about 10 nm or less. However, embodiments are not limited thereto.

Lateral surfaces of the conductive layers 130 may be flat with lateral surfaces of the insulating layers 120. Here, the lateral surfaces of the conductive layers 130 and the lateral surfaces of the insulating layers 120 may be perpendicular to the surface of the substrate 110.

A ferroelectric layer 150 is provided on the lateral surface of each of the conductive layers 130. Ferroelectrics have spontaneous dipoles (electric dipoles), that is, spontaneous polarization, because the charge distribution in unit cells is non-centrosymmetric in a crystallized material structure. In addition, ferroelectrics have a remnant polarization due to dipoles even in the absence of an external electric field. Furthermore, the direction of polarization in a ferroelectric may be switched on a domain basis by an external electric field.

The ferroelectric layer 150 may include, for example, a fluorite-based material or perovskite. Here, examples of the perovskite may include PZT, $BaTiO_3$, $PbTiO_3$, or the like. For example, the fluorite-based material may include at least one oxide selected from the group consisting of oxides of Hf, Si, Al, Zr, Y, La, Gd, and Sr.

For example, the ferroelectric layer 150 may include at least one selected from the group consisting of hafnium oxide (HfO), zirconium oxide (ZrO), and hafnium zirconium oxide (HfZrO). Hafnium oxide (HfO), zirconium oxide (ZrO), and hafnium zirconium oxide (HfZrO), which may be included in the ferroelectric layer 150, may have an orthorhombic crystal system as a crystal structure. The ferroelectric layer 150 may further include, for example, at least one dopant selected from the group consisting of Si, Al, La, Y, Sr, and Gd. However, the listed materials are merely examples, and other various materials may be included in the ferroelectric layer 150.

A channel layer 160 is provided on the lateral surfaces of the conductive layers 130 and the lateral surfaces of the insulating layers 120 to cover the ferroelectric layer 150. The channel layer 160 may correspond to the conductive layers 130 and may be perpendicular to the surface of the substrate 110. Therefore, the memory cells MC, which are vertically stacked, may share the channel layer 160. The channel layer 160 is in contact with the lateral surfaces of the insulating layers 120, and the ferroelectric layer 150 is provided between the channel layer 160 and the lateral surfaces of the conductive layers 130. Therefore, the channel layer 160 may have a shape protruding according to the ferroelectric layer 150 at the lateral surfaces of the conductive layers 130.

The channel layer 160 may include a semiconductor material. For example, the channel layer 160 may include, for example, Si, Ge, SiGe, a Group III-V semiconductor, or the like. In addition, the channel layer 160 may include, for example, an oxide semiconductor, a nitride semiconductor, an oxynitride semiconductor, a 2D semiconductor material, quantum dots (QDs), or an organic semiconductor. Here, the oxide semiconductor may include, for example, InGaZnO, or the like; the 2D semiconductor material may include, for example, a transition metal dichalcogenide (TMD), graphene, or the like; and the QDs may include colloidal QDs, nanocrystal structures, or the like. However, the listed materials are merely examples, and embodiments are not limited thereto.

The channel layer 160 may further include a dopant. Here, the dopant may include a p-type dopant or an n-type dopant. The p-type dopant may include, for example, a Group III element such as B, Al, Ga, In, or the like, and the n-type dopant may include, for example, a Group V element such as P, As, Sb, or the like.

A source and a drain may be provided in the channel layer 160 at lower and upper sides of each of the memory cells MC, and channels corresponding to the conductive layers 130 may be formed between the sources and the drains. The sources and the drains may be formed between the memory cells MC in such a manner that adjacent memory cells MC share a source and a drain. As described above, when the conductive layers 130 have a very small thickness (e.g., equal to or less than about 10 nm), the channels may have a very small length corresponding to the thickness of the conductive layers 130.

In each of the memory cells MC, the direction of ferroelectric polarization may be determined according to a positive (+) or negative (−) gate voltage applied to the conductive layer 130, thereby performing a memory operation. Here, a gate voltage inducing an electric field stronger than a coercive field in which ferroelectric polarization switching occurs may be applied to the conductive layer 130 to perform a non-volatile memory operation. A voltage controller (not shown) including power circuitry may apply the gate voltage to the conductive layer 130.

The non-volatile memory device 100 of the present example embodiment may be manufactured as follows. First, the insulating layers 120 and the conductive layers 130 are alternately stacked in a direction perpendicular to the substrate 110. Then, the ferroelectric layer 150 is selectively formed only on the lateral surfaces of the conductive layers 130 using a selective growth process or an inhibitor, and the channel layer 160 is then formed on the lateral surfaces of the insulating layers 120 and the lateral surfaces of the conductive layers 130 to cover the ferroelectric layer 150.

The non-volatile memory device 100 may also be manufactured as follows. First, a plurality of first insulating layers 120 and a plurality of second insulating layers (not shown) are alternately stacked in a direction perpendicular to the substrate 110. Then, after selectively forming the ferroelectric layer 150 only on lateral surfaces of the second insulating layers, the channel layer 160 is formed on lateral surfaces of the first insulating layers 120 and lateral surfaces of the second insulating layers to cover the ferroelectric layer 150. Next, the second insulating layers are removed by etching, and then, the conductive layers 130 are deposited in regions from which the second insulating layers are removed.

In vertical NAND flash memory devices, gaps between memory cells may decrease as the degree of integration of the vertical NAND flash memory devices increases, which may increase interference between the memory cells and cause loss of charge. In a NAND flash memory device having a charge trap flash (CTF) structure, a plurality of memory cells share one charge trap layer, and thus a lateral charge migration phenomenon may occur, which may worsen the operational reliability of the NAND flash memory device as the gaps between the memory cells decrease. Furthermore, existing flash memory devices include a plurality of insulating layers such as layers of blocking oxide/nitride/tunneling oxide, and thus write/erase operations are repeated using a high voltage corresponding to the thickness of the plurality of insulating layers. However, such repeated operations may decrease the reliability of the tunneling oxide, and the existing flash memory devices may have a large height due to the plurality of insulating layers, having a negative effect on vertical integration In the vertical non-volatile memory device 100 of the present example embodiment, the insulating layers 120 and the conductive layers 130 are alternately and vertically stacked on the substrate 110, and the ferroelectric layer 150 and the channel layer 160 are provided on the lateral surfaces of the insulating layers 120 and the lateral surfaces of the conductive layers 130. Here, each of the conductive layers 130 may be deposited to a very small thickness (for example, a thickness of about 10 nm or less), and channels having a very short length corresponding to the thickness of the conductive layers 130 may be formed in the channel layer 160. Therefore, the memory cells MC may have a small height, and the vertical non-volatile memory device 100 may have a high degree of integration.

Figure 2:
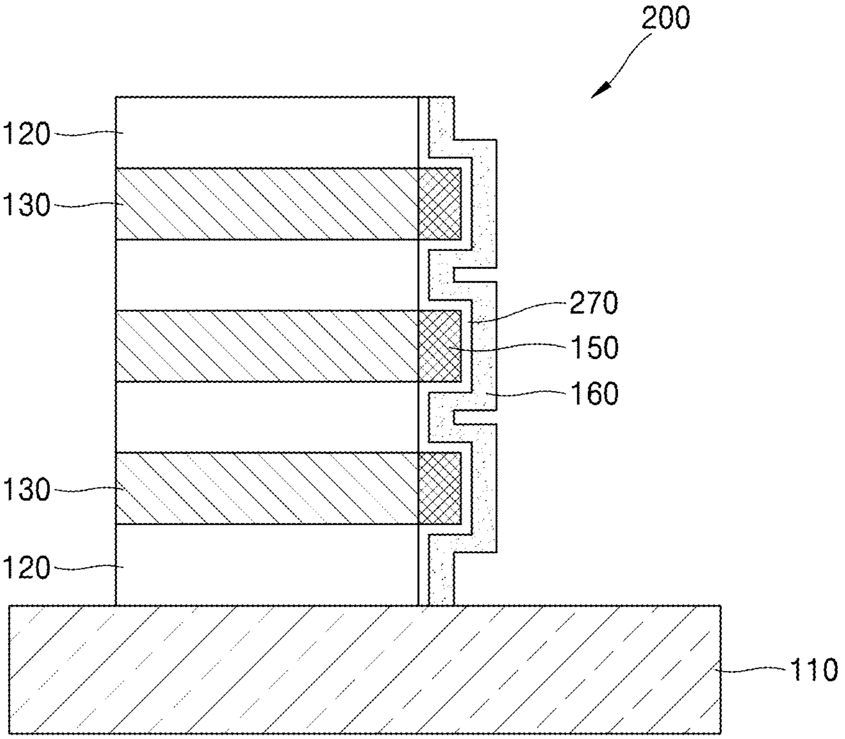
FIG. 2 is a cross-sectional view schematically illustrating a vertical non-volatile memory device according to another example embodiment.

FIG. 2 is a cross-sectional view schematically illustrating a vertical non-volatile memory device 200 according to another example embodiment. The vertical non-volatile memory device 200 shown in FIG. 2 is the same as the vertical non-volatile memory device 100 shown in FIG. 1 except that a paraelectric layer is provided between a ferroelectric layer and a channel layer. Hereinafter, differences from the previous example embodiment will be mainly described.

Referring to FIG. 2, a plurality of insulating layers 120 and a plurality of conductive layers 130 are alternately and vertically stacked on a substrate 110, and a ferroelectric layer 150 is selectively formed on lateral surfaces of the conductive layers 130.

A paraelectric layer 270 is provided on the lateral surfaces of the conductive layers 130 and lateral surfaces of the insulating layers 120 to cover the ferroelectric layer 150, and a channel layer 160 is provided on the paraelectric layer 270. The paraelectric layer 270 is in contact with the lateral surfaces of the insulating layers 120, and the ferroelectric layer 150 is provided between the paraelectric layer 270 and the lateral surfaces of the conductive layers 130. Therefore, the paraelectric layer 270 and the channel layer 160 may have shapes protruding according to the ferroelectric layer 150 at the lateral surfaces of the conductive layers 130.

The paraelectric layer 270 may include, for example, at least one selected from the group consisting of a silicon oxide, silicon nitride, aluminum oxide, and a silicon oxynitride. However, embodiments are not limited thereto. For example, when the channel layer 160 includes silicon, the paraelectric layer 270 may include a silicon oxide. However, embodiments are not limited thereto.

Figure 3:
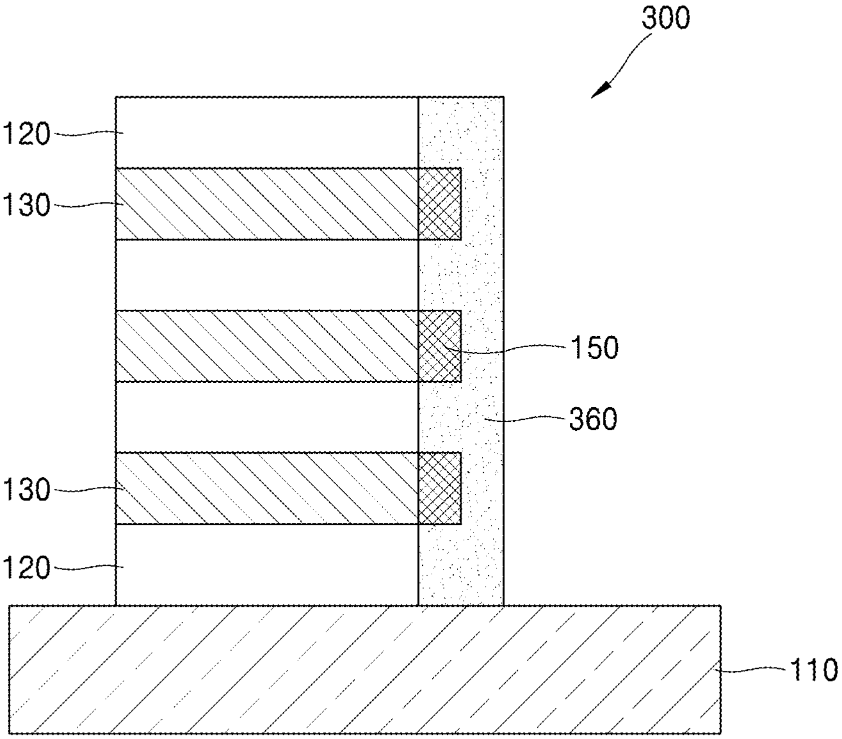
FIG. 3 is a cross-sectional view schematically illustrating a vertical non-volatile memory device according to another example embodiment.

FIG. 3 is a cross-sectional view schematically illustrating a vertical non-volatile memory device 300 according to another example embodiment.

Referring to FIG. 3, a plurality of insulating layers 120 and a plurality of conductive layers 130 are alternately and vertically stacked on a substrate 110. Lateral surfaces of the conductive layers 130 may be flat with lateral surfaces of the insulating layers 120. A ferroelectric layer 150 is selectively provided on the lateral surfaces of the conductive layers 130. A channel layer 360 is provided on the lateral surfaces of the conductive layers 130 and the lateral surfaces of the insulating layers 120 to cover the ferroelectric layer 150.

Unlike the channel layer 160 illustrated in FIG. 1, the channel layer 360 may have a flat surface in the present example embodiment. The channel layer 360 may be formed on the lateral surfaces of the conductive layers 130 and the lateral surfaces of the insulating layers 120 and may have a sufficient thickness for covering the ferroelectric layer 150, and a subsequent process may be performed to reduce line edge roughness (LER).

Figure 4:
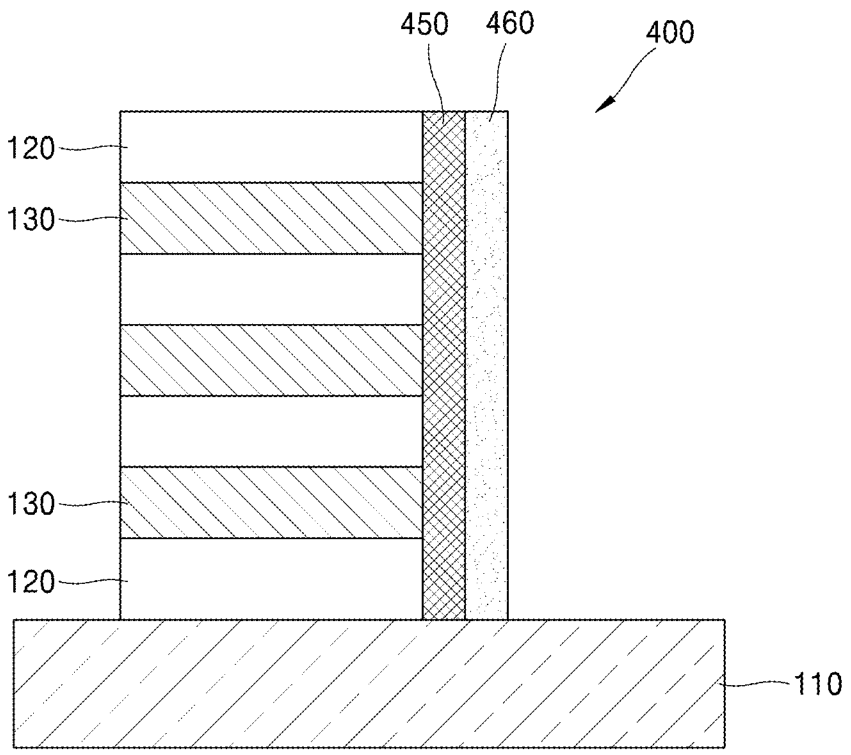
FIG. 4 is a cross-sectional view schematically illustrating a vertical non-volatile memory device according to another example embodiment.

FIG. 4 is a cross-sectional view schematically illustrating a vertical non-volatile memory device 400 according to another example embodiment.

Referring to FIG. 4, a plurality of insulating layers 120 and a plurality of conductive layers 130 are alternately and vertically stacked on a substrate 110. Lateral surfaces of the conductive layers 130 may be flat with lateral surfaces of the insulating layers 120. A ferroelectric layer 450 is provided on the lateral surfaces of the insulating layers 120 and the lateral surfaces of the conductive layers 130. Here, the ferroelectric layer 450 may cover the flat lateral surfaces of the conductive layers 130 and the insulating layers 120. That is, the ferroelectric layer 450 may extend from the lateral surfaces of the conductive layers 130 to the lateral surfaces of the insulating layers 120.

A channel layer 460 is provided to cover the ferroelectric layer 450. Although not shown in FIG. 4, a paraelectric layer may be further provided between the ferroelectric layer 450 and the channel layer 460. The paraelectric layer may cover the ferroelectric layer 450.

Figure 5:
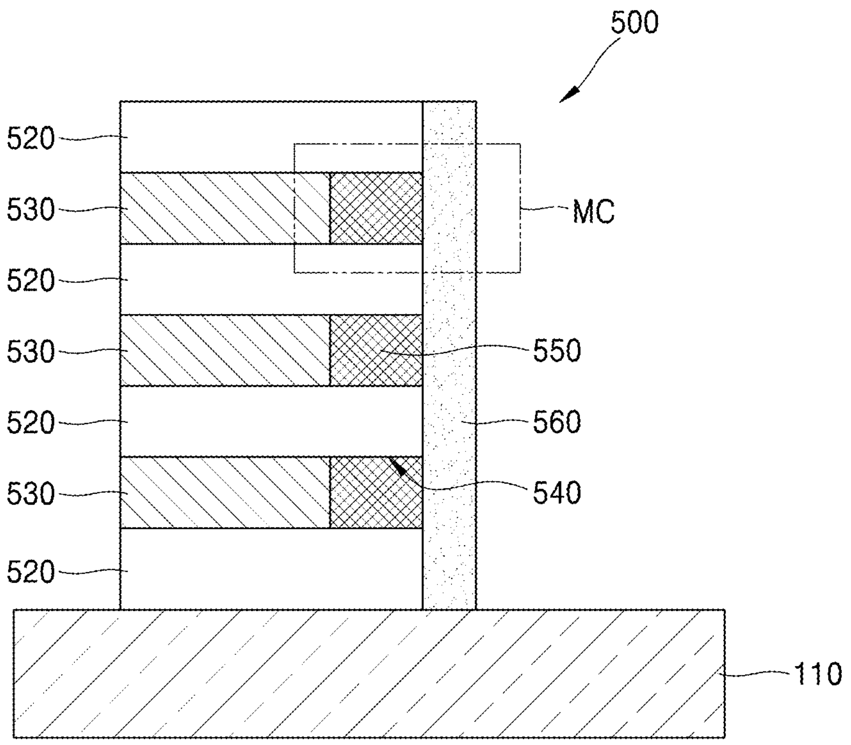
FIG. 5 is a cross-sectional view schematically illustrating a vertical non-volatile memory device according to another example embodiment.

FIG. 5 is a cross-sectional view schematically illustrating a vertical non-volatile memory device 500 according to another example embodiment.

Referring to FIG. 5, the vertical non-volatile memory device 500 includes: a substrate 110; and a vertical stack structure in which a plurality of memory cells MC are stacked in a direction perpendicular to a surface of the substrate 110. The memory cells MC include insulating layers 520 and conductive layers 530 that are alternately stacked in a direction perpendicular to the surface of the substrate 110. Each of the insulating layers 520 and the conductive layers 530 may extend in a direction parallel to the surface of the substrate 110.

The conductive layers 530 may include, for example, a conductive material such as a metal, a metal nitride, polysilicon, a 2D conductive material, or the like. However, the listed materials are merely examples. The conductive layers 530 may have a small thickness equal to or less than, for example, about 10 nm, but is not limited thereto. The insulating layers 520 may include, for example, a silicon oxide, silicon nitride, or the like, but the listed materials are merely examples. The insulating layers 520 may have a thickness of about 10 nm or less, but is not limited thereto.

In the present example embodiment, lateral surfaces of the conductive layers 530 may be recessed from lateral surfaces of the insulating layers 520 to provide gaps 540. Gaps 540 may be formed by the lateral surfaces of the conductive layers 530 by alternately stacking the insulating layers 520 and the conductive layers 530, and then selectively etching only the lateral surfaces of the conductive layers 530.

The gaps 540 formed by the lateral surfaces of the conductive layers 530 may be filled with a ferroelectric layer 550. Here, a lateral surface of the ferroelectric layer 550 may be flat with the lateral surfaces of the insulating layers 520. As described above, the ferroelectric layer 550 may be selectively provided only on the lateral surfaces of the conductive layers 530. The ferroelectric layer 550 may be formed using, for example, a selective growth process or an inhibitor.

The ferroelectric layer 550 may include, for example, a fluorite-based material or perovskite. Here, the perovskite may include, for example, PZT, $BaTiO_3$, $PbTiO_3$, or the like. For example, the fluorite-based material may include at least one oxide selected from the group consisting of oxides of Hf, Si, Al, Zr, Y, La, Gd, and Sr.

For example, the ferroelectric layer 550 may include at least one selected from the group consisting of hafnium oxide (HfO), zirconium oxide (ZrO), and hafnium-zirconium oxide (HfZrO). Hafnium oxide (HfO), zirconium oxide (ZrO), and hafnium-zirconium oxide (HfZrO), which may be included in the ferroelectric layer 550, may have an orthorhombic crystal system as a crystal structure. The ferroelectric layer 550 may further include, for example, at least one dopant selected from the group consisting of Si, Al, La, Y, Sr, and Gd.

A channel layer 560 is provided on the lateral surfaces of the insulating layers 520 and the lateral surface of the ferroelectric layer 550. The channel layer 560 may cover the lateral surfaces of the insulating layers 520 and the ferroelectric layer 550 which are flat with each other. A surface of the channel layer 560 may be flat.

The channel layer 560 may include a semiconductor material. For example, the channel layer 560 may include, for example, Si, Ge, SiGe, a Group III-V semiconductor, or the like. In addition, for example, the channel layer 560 may include an oxide semiconductor, a nitride semiconductor, an oxynitride semiconductor, a 2D semiconductor material, QDs, or an organic semiconductor. The channel layer 560 may further include a p-type dopant or an n-type dopant.

A source and a drain may be provided in the channel layer 560 at lower and upper sides of each of the memory cells MC, and channels corresponding to the conductive layers 530 may be formed between the sources and the drains. Therefore, when the conductive layers 530 have a very thin thickness equal to or less than about 10 nm, the channels may have a very small length corresponding to the thickness of the conductive layers 530.

In each of the memory cells MC, the direction of ferroelectric polarization in the ferroelectric layer 550 between the conductive layer 530 and the channel layer 560 may be determined according to a positive (+) or negative (−) gate voltage applied to the conductive layer 530, thereby performing a memory operation. Here, a gate voltage inducing an electric field stronger than a coercive field in which ferroelectric polarization switching occurs may be applied to the conductive layer 530 to perform a non-volatile memory operation.

While FIG. 5 and FIG. 6 (discussed below) illustrate a sidewall of the conductive layers 530 and a sidewall of the ferroelectric layers 550 may be vertical to an upper surface of the substrate 110, example embodiments are not limited thereto. In some embodiments, the gaps 540 in FIGS. 5-6 may be modified so a sidewall of the conductive layers 530 may be curved (e.g., concave) and a sidewall of the ferroelectric layers 550 may be curved (e.g., convex) at interfaces between the conductive layers 530 and ferroelectric layers 550. Similarly, although not shown in FIG. 7, a sidewall of the conductive layers 530 may be curved (e.g., concave) and a sidewall of the ferroelectric layers 750 may be curved (e.g., convex) at interfaces between the conductive layers 530 and ferroelectric layers 750.

Figure 6:
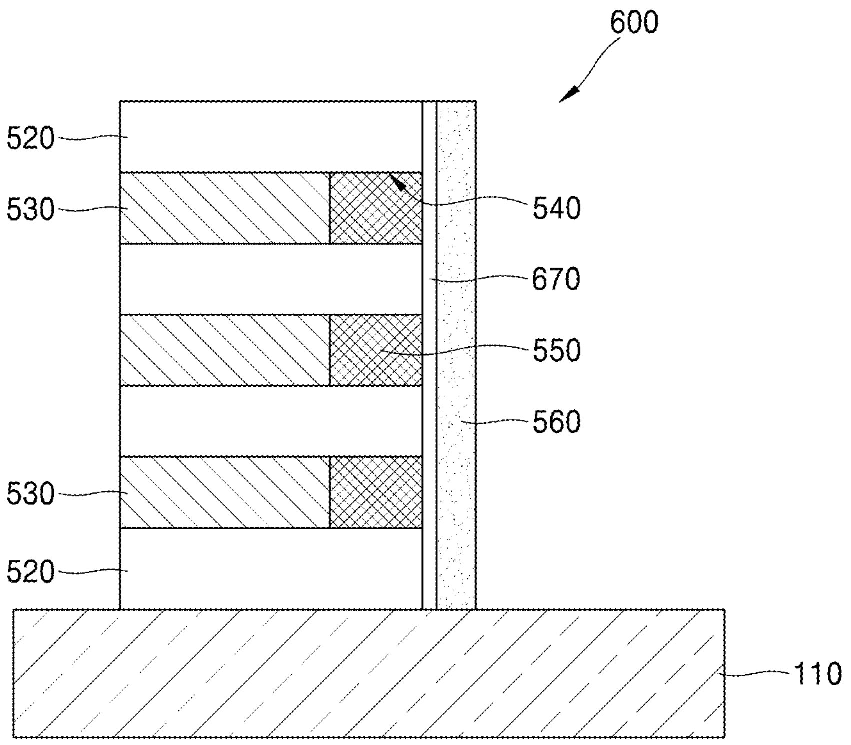
FIG. 6 is a cross-sectional view schematically illustrating a vertical non-volatile memory device according to another example embodiment.

FIG. 6 is a cross-sectional view schematically illustrating a vertical non-volatile memory device 600 according to another example embodiment. The vertical non-volatile memory device 600 illustrated in FIG. 6 is the same as the vertical non-volatile memory device 500 illustrated in FIG. 5 except that a paraelectric layer 670 is provided between a ferroelectric layer 550 and a channel layer 560.

Referring to FIG. 6, a plurality of insulating layers 520 and a plurality of conductive layers 530 are alternately and vertically stacked on a substrate 110. Here, lateral surfaces of the conductive layers 530 are recessed from lateral surfaces of the insulating layers 520 to form gaps 540, and the gaps 540 are filled with the ferroelectric layer 550.

The paraelectric layer 670 is provided on flat lateral surfaces of the ferroelectric layer 550 and the insulating layers 520. Here, the paraelectric layer 670 may cover the lateral surfaces of the ferroelectric layer 550 and the insulating layers 520. Alternatively, the paraelectric layer 670 may cover only the lateral surface of the ferroelectric layer 550.

The channel layer 560 is provided on the paraelectric layer 670. The paraelectric layer 670 may include, for example, at least one selected from the group consisting of a silicon oxide, silicon nitride, aluminum oxide, and a silicon oxynitride, but is not limited thereto.

Figure 7:
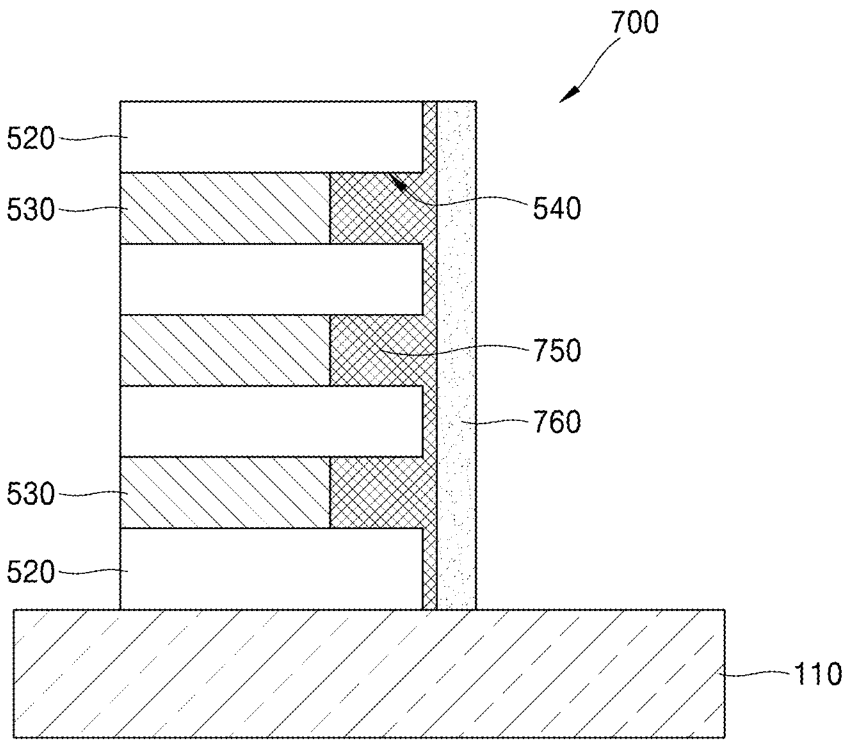
FIG. 7 is a cross-sectional view schematically illustrating a vertical non-volatile memory device according to another example embodiment.

FIG. 7 is a cross-sectional view schematically illustrating a vertical non-volatile memory device 700 according to another example embodiment.

Referring to FIG. 7, a plurality of insulating layers 520 and a plurality of conductive layers 530 are alternately and vertically stacked on a substrate 110, and lateral surfaces of the conductive layers 530 are recessed from lateral surfaces of the insulating layers 520.

Gaps 540 formed by the lateral surfaces of the conductive layers 530 are filled with a ferroelectric layer 750, and the ferroelectric layer 750 may extend onto the lateral surfaces of the insulating layers 520. That is, the ferroelectric layer 750 may cover the lateral surfaces of the conductive layers 530 and the lateral surfaces of the insulating layers 520. Here, the ferroelectric layer 750 may have a flat surface, and a channel layer 760 may be provided on the ferroelectric layer 750. A paraelectric layer (not shown) may be further provided between the ferroelectric layer 750 and the channel layer 760.

Figure 8:
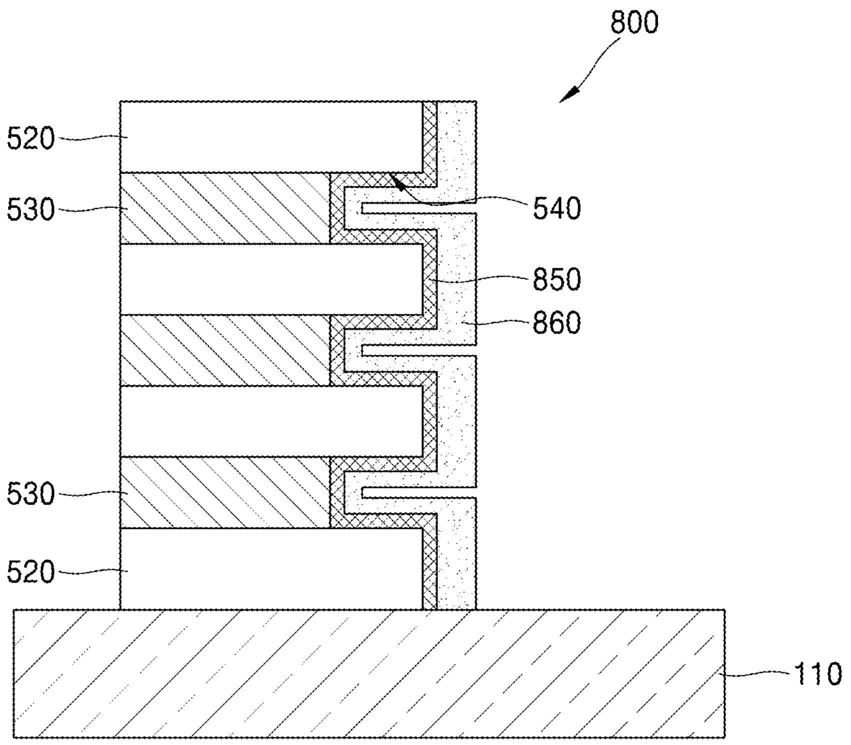
FIG. 8 is a cross-sectional view schematically illustrating a vertical non-volatile memory device according to another example embodiment.

FIG. 8 is a cross-sectional view schematically illustrating a vertical non-volatile memory device 800 according to another example embodiment.

Referring to FIG. 8, a plurality of insulating layers 520 and a plurality of conductive layers 530 are alternately and vertically stacked on a substrate 110, and lateral surfaces of the conductive layers 530 are recessed from lateral surfaces of the insulating layers 520 to provide gaps 540.

A ferroelectric layer 850 having a given thickness is provided on inner walls of gaps 540 formed by the lateral surfaces of the conductive layers 530 such that the lateral surfaces of the conductive layers 530 may be covered with the ferroelectric layer 850, and the ferroelectric layer 850 extends even onto the lateral surfaces of the insulating layers 520. In addition, a channel layer 860 having a given thickness covers the ferroelectric layer 850. In addition, a paraelectric layer (not shown) may be further provided between the ferroelectric layer 850 and the channel layer 860.

Although not illustrated in FIG. 8, a sidewall of the conductive layers 530 may be curved (e.g., concave) and a sidewall of the ferroelectric layer 850 may be curved (e.g., convex) at interfaces between the conductive layers 530 and ferroelectric layer 850.

Figure 9A:
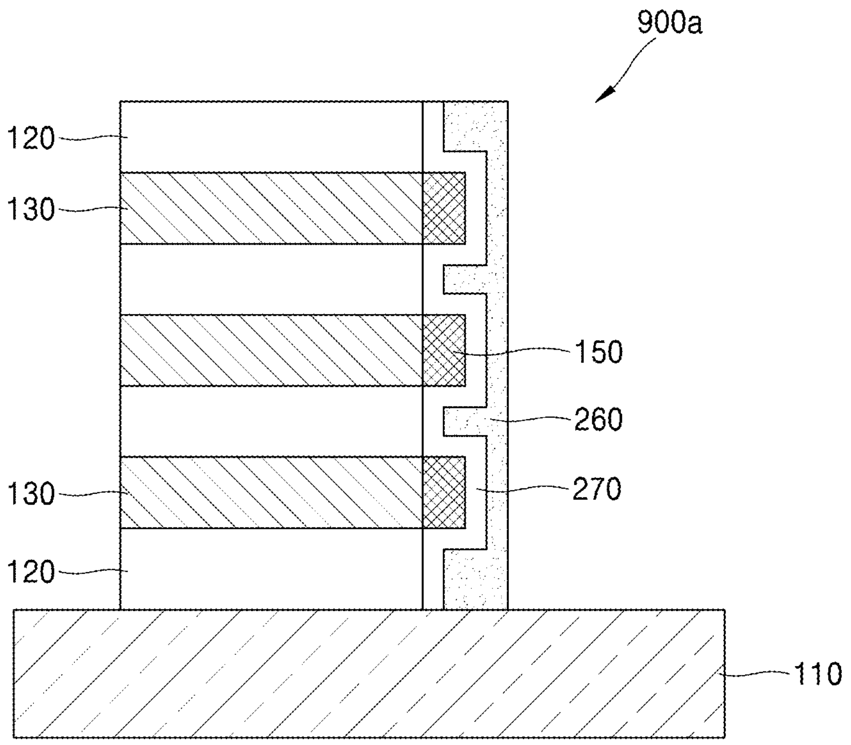
FIGS. 9A to 9C are cross-sectional views schematically illustrating vertical non-volatile memory devices according to some example embodiments.
Figure 9B:
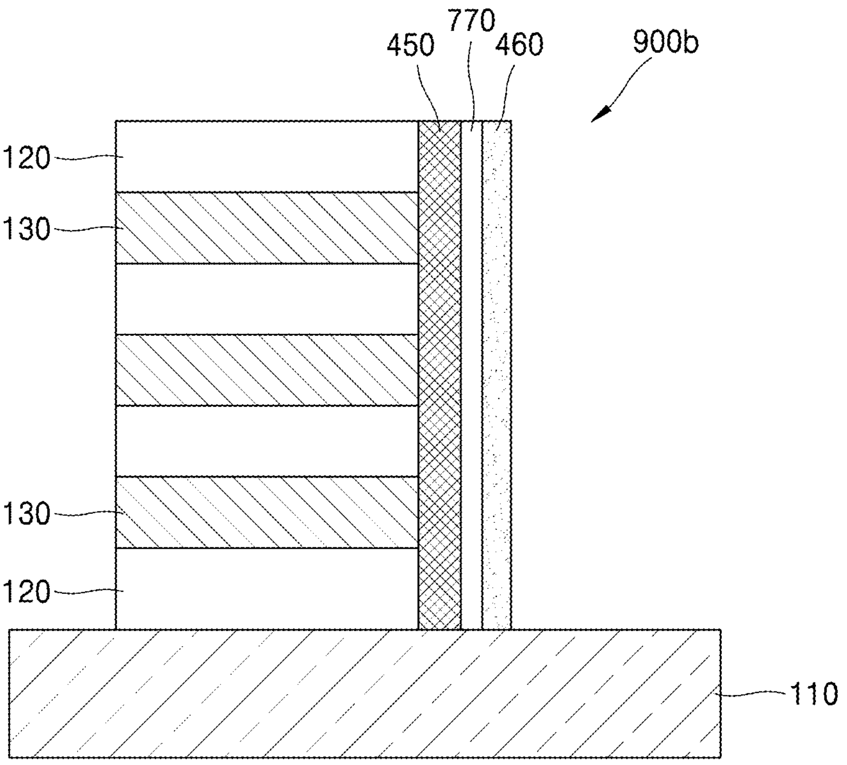
Figure 9C:
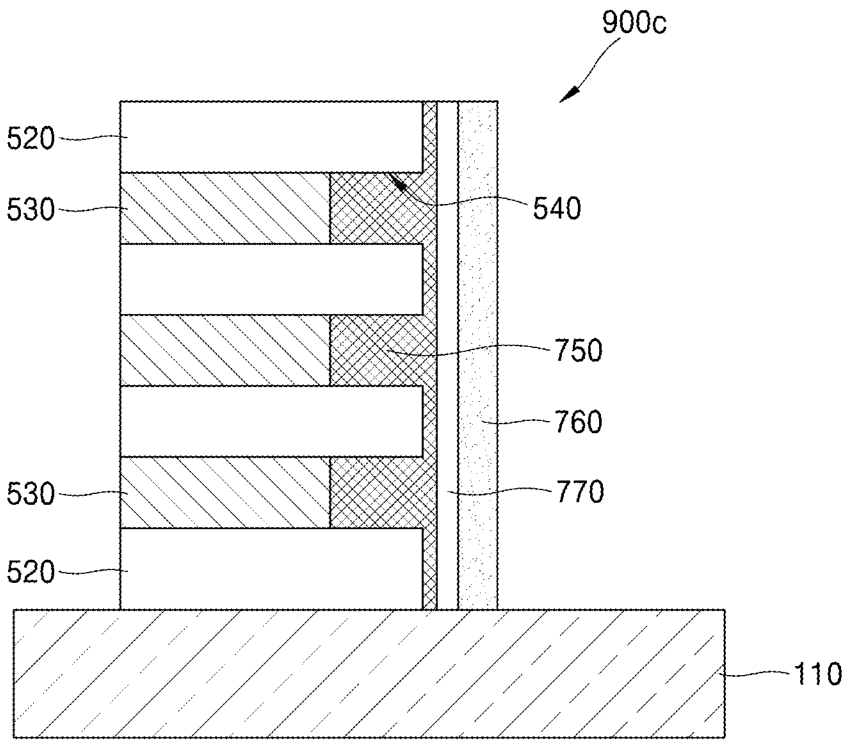

FIGS. 9A to 9C are cross-sectional views schematically illustrating vertical non-volatile memory devices according to some example embodiments.

Referring to FIG. 9A, the vertical non-volatile memory device 900*a* shown in FIG. 9A is similar to the vertical non-volatile memory device 300 shown in FIG. 3 except that a paraelectric layer is provided between a ferroelectric layer and a channel layer and a shape of the channel layer is different. Hereinafter, differences from the previous example embodiment will be mainly described.

Referring to FIG. 9A, a plurality of insulating layers 120 and a plurality of conductive layers 130 are alternately and vertically stacked on a substrate 110, and a ferroelectric layer 150 is selectively formed on lateral surfaces of the conductive layers 130.

A paraelectric layer 270 is provided on the lateral surfaces of the conductive layers 130 and lateral surfaces of the insulating layers 120 to cover the ferroelectric layer 150, and a channel layer 260 is provided on the paraelectric layer 270. The paraelectric layer 270 is in contact with the lateral surfaces of the insulating layers 120, and the ferroelectric layer 150 is provided between the paraelectric layer 270 and the lateral surfaces of the conductive layers 130. Therefore, the paraelectric layer 270 may have shapes protruding according to the ferroelectric layer 150 at the lateral surfaces of the conductive layers 130.

The paraelectric layer 270 may include, for example, at least one selected from the group consisting of a silicon oxide, silicon nitride, aluminum oxide, and a silicon oxynitride. However, embodiments are not limited thereto. For example, when the channel layer 260 includes silicon, the paraelectric layer 270 may include a silicon oxide. However, embodiments are not limited thereto.

Like the channel layer 360 illustrated in FIG. 3, the channel layer 260 may have a flat surface in the present example embodiment. The flat surface may be a surface of the channel layer 360 that is opposite the paraelectric layer 270. However, unlike the channel layer 360 illustrated in FIG. 3, the channel layer 260 may have a smaller width and may be spaced apart from lateral surfaces of the insulating layers 120 and ferroelectric layer 150 because the paraelectric layer 270 is between the channel layer 260 and the lateral surfaces of the insulating layers 120 and ferroelectric layer 150.

Referring to FIG. 9B, the vertical non-volatile memory device 900*b* shown in FIG. 9B is similar to the vertical non-volatile memory device 400 shown in FIG. 4 except that a paraelectric layer 770 is provided between the ferroelectric layer 450 and the channel layer 460.

Referring to FIG. 9C, the vertical non-volatile memory device 900*c* shown in FIG. 9C is similar to the vertical non-volatile memory device 700 shown in FIG. 7 except that a paraelectric layer 770 is provided between the ferroelectric layer 750 and the channel layer 760.

The non-volatile memory devices 100 to 800 and 900*a* to 990*c* described above may be used in various electronic apparatuses to store data.

Figure 10:
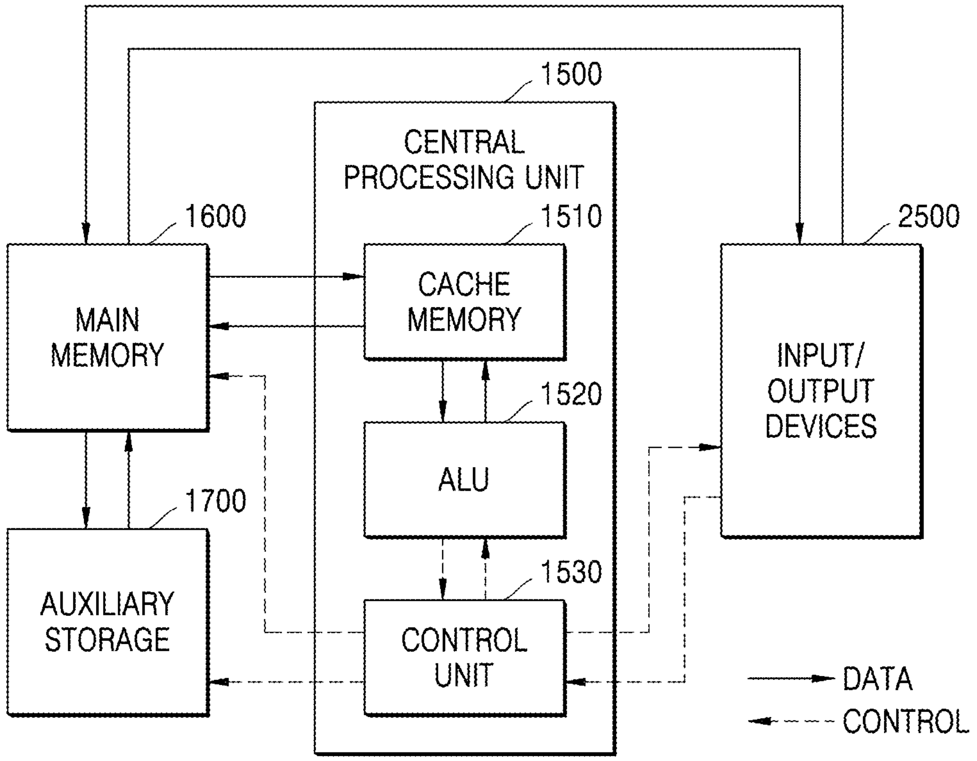
FIG. 10 is a conceptual view schematically illustrating a device architecture that may be applied to electronic apparatuses according to example embodiments.

FIG. 10 is a conceptual view schematically illustrating a device architecture that may be applied to electronic apparatuses according to example embodiments.

Referring to FIG. 10, a cache memory 1510, an ALU 1520, and a control unit 1530 may form a central processing unit (CPU) 1500, and the cache memory 1510 may be a static random access memory (SRAM). A main memory 1600 and an auxiliary storage 1700 may be provided separately from the CPU 1500. The main memory 1600 may include a DRAM device, and the auxiliary storage 1700 may include any of the vertical non-volatile memory (NVM) devices 100 to 800 and 900*a* to 990*c* described above. The main memory 1600 and CPU 1500 may be connected to one or more input/output devices 2500 (e.g., processing circuitry). In some cases, the device architecture may be implemented in the form in which unit computing devices and unit memory devices are adjacent to each other in one chip without any distinction between sub-units.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As described above, in the vertical non-volatile memory device of the one or more of the above embodiments, the insulating layers and the conductive layers are alternately and vertically stacked on the substrate, and the ferroelectric layer and the channel layer are provided on the lateral surfaces of the insulating layers and the lateral surfaces of the conductive layers. Here, each of the conductive layers may be deposited to a very small thickness (for example, about 10 nm or less), and channels having a very small length corresponding to the thickness of the conductive layers may be formed in the channel layer. Therefore, the memory cells MC may have a small height, and the vertical non-volatile memory device may have a high degree of integration. Although embodiments have been described above, the embodiments are merely examples, and those of ordinary skill in the art could make various modifications therein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A vertical non-volatile memory device comprising:

a substrate;

a plurality of insulating layers and a plurality of conductive layers alternately stacked on a surface of the substrate in a direction perpendicular to the surface of the substrate;

a channel layer on the substrate, the channel layer extending in the direction perpendicular to the surface of the substrate, the channel layer on lateral surfaces of the plurality of insulating layers and lateral surfaces of the plurality of conductive layers; and a ferroelectric layer between the channel layer and the lateral surfaces of the plurality of conductive layers, wherein the lateral surfaces of the plurality of conductive layers are flat with the lateral surfaces of the plurality of insulating layers, and wherein the channel layer covers an upper surface of the ferroelectric layer, a lower surface of the ferroelectric layer, and a side surface of the ferroelectric layer.

2. The vertical non-volatile memory device of claim 1, wherein each of the plurality of insulating layers and each of the plurality of conductive layers extend in a direction parallel to the surface of the substrate.

3. The vertical non-volatile memory device of claim 1, wherein the channel layer corresponds to the plurality of conductive layers.

4. The vertical non-volatile memory device of claim 1, wherein the ferroelectric layer does not contact upper surfaces of the plurality of insulating layers or lower surfaces of the plurality of insulating layers.

5. The vertical non-volatile memory device of claim 1, wherein the ferroelectric layer is only on the lateral surfaces of the plurality of conductive layers such that the ferroelectric layer is not on the lateral surfaces of the plurality of insulating layers.

6. The vertical non-volatile memory device of claim 1, wherein when a gate voltage is applied to the plurality of conductive layers, the gate voltage induces an electric field stronger than a coercive field in which ferroelectric polarization switching occurs in the ferroelectric layer.

7. The vertical non-volatile memory device of claim 1, wherein each of the plurality of conductive layers has a thickness of about 10 nm or less.

8. The vertical non-volatile memory device of claim 1, wherein the plurality of conductive layers comprise a metal, a metal nitride, polysilicon, or a 2D conductive material.

9. The vertical non-volatile memory device of claim 1, wherein the channel layer comprises Si, Ge, a Group III-V semiconductor, an oxide semiconductor, a nitride semiconductor, an oxynitride semiconductor, a 2D semiconductor material, quantum dots, or an organic semiconductor.

10. The vertical non-volatile memory device of claim 1, wherein the ferroelectric layer comprises a fluorite-based material or perovskite.

11. The vertical non-volatile memory device of claim 10, wherein the ferroelectric layer comprises an oxide of at least one of Hf and Zr.

12. The vertical non-volatile memory device of claim 11, wherein the ferroelectric layer further comprises at least one dopant selected from the group consisting of Si, Al, La, Y, Sr, and Gd.

13. The vertical non-volatile memory device of claim 1, further comprising: a paraelectric layer between the ferroelectric layer and the channel layer.

14. The vertical non-volatile memory device of claim 13, wherein the paraelectric layer comprises a silicon oxide, a silicon nitride, an aluminum oxide, or a silicon oxynitride.

15. An electronic apparatus comprising:

the vertical non-volatile memory device of claim 1.

16. A vertical non-volatile memory device comprising:

a substrate;

a plurality of insulating layers and a plurality of conductive layers alternately stacked on a surface of the substrate in a direction perpendicular to the surface of the substrate;

a channel layer on the substrate, the channel layer extending in the direction perpendicular to the surface of the substrate, the channel layer on lateral surfaces of the plurality of insulating layers and lateral surfaces of the plurality of conductive layers; and a ferroelectric layer between the channel layer and the lateral surfaces of the plurality of conductive layers, wherein the lateral surfaces of the plurality of conductive layers are recessed from the lateral surfaces of the plurality of insulating layers, the lateral surfaces of the plurality of conductive layers that are recessed from the lateral surfaces of the plurality of insulating layers define gaps with underlying and overlying insulating layers among the plurality of insulating layers, and the gaps by the lateral surfaces of the plurality of conductive layers are completely filled with the ferroelectric layer, wherein the ferroelectric layer is only on the lateral surfaces of the plurality of conductive layers such that the ferroelectric layer is not on the lateral surfaces of the plurality of insulating layers, or wherein a first portion of the ferroelectric layer extends onto the lateral surfaces of the plurality of insulating layers, a second portion of the ferroelectric layer extends onto the lateral surfaces of the plurality of conductive layers, and a horizontal thickness of the first portion of the ferroelectric layer is less than a horizontal thickness of the second portion of the ferroelectric layer.

17. An electronic apparatus comprising:

the vertical non-volatile memory device of claim 7.

18. The vertical non-volatile memory device of claim 16, wherein the ferroelectric layer extends onto the lateral surfaces of the plurality of insulating layers.

19. The vertical non-volatile memory device of claim 16, wherein the ferroelectric layer extends to the lateral surfaces of the plurality of insulating layers from the lateral surfaces of the plurality of conductive layers, and wherein the channel layer directly contacts the lateral surfaces of the plurality of insulating layers.

* * * * *